United States Patent
Maeda et al.

(10) Patent No.: US 8,404,969 B2
(45) Date of Patent: Mar. 26, 2013

(54) URETHANE RESIN, ACTINIC ENERGY RAY CURABLE ADHESIVE, AND BACK PROTECTIVE SHEET FOR SOLAR CELL

(75) Inventors: Satoshi Maeda, Tokyo (JP); Mitsuo Umezawa, Tokyo (JP); Hiroshi Yamaguchi, Tokyo (JP); Takeshi Yoshikawa, Tokyo (JP)

(73) Assignee: Toyo Ink SC Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/325,539

(22) Filed: Dec. 14, 2011

(65) Prior Publication Data

US 2012/0082853 A1   Apr. 5, 2012

Related U.S. Application Data

(63) Continuation of application No. PCT/JP2010/060057, filed on Jun. 14, 2010.

(30) Foreign Application Priority Data

| | | |
|---|---|---|
| Jun. 15, 2009 | (JP) | 2009-142475 |
| Jun. 15, 2009 | (JP) | 2009-142476 |
| Dec. 9, 2009 | (JP) | 2009-279068 |

(51) Int. Cl.
  *H01L 31/00* (2006.01)
  *B32B 27/40* (2006.01)
  *C09J 163/00* (2006.01)
  *C08G 18/67* (2006.01)
(52) U.S. Cl. ........ 136/259; 428/423.1; 528/75; 523/400
(58) Field of Classification Search .......... 136/259; 428/423.1; 528/75; 523/400
See application file for complete search history.

(56) References Cited

U.S. PATENT DOCUMENTS

| | | | |
|---|---|---|---|
| 7,493,000 B2 * | 2/2009 | Yamaguchi et al. | 385/128 |
| 2005/0282938 A1 * | 12/2005 | Yamaguchi et al. | 523/513 |
| 2007/0166642 A1 * | 7/2007 | Inoue | 430/270.1 |
| 2010/0229945 A1 * | 9/2010 | Suzuta et al. | 136/259 |

FOREIGN PATENT DOCUMENTS

| | | |
|---|---|---|
| JP | 3-273017 | 12/1991 |
| JP | 9-268215 | 10/1997 |
| JP | 2004-217808 | 8/2004 |
| JP | 2007-169453 | 7/2007 |
| JP | 2007-253463 | 10/2007 |
| JP | 2007-320218 | 12/2007 |
| JP | 2008-69307 | 3/2008 |
| JP | 2008-127475 | 6/2008 |

OTHER PUBLICATIONS

International Search Report for PCT/JP2010/060057, mailed Sep. 21, 2010.

* cited by examiner

*Primary Examiner* — Thao T. Tran
(74) *Attorney, Agent, or Firm* — Nixon & Vanderhye P.C.

(57) ABSTRACT

An actinic energy ray curable adhesive contains a urethane resin (D) and a epoxy resin (E). The urethane resin (D) is prepared by reacting a diol ingredient (A1) having no (meth)acryloyl group, an optional diol ingredient (A2) having no (meth)acryloyl group, no carbonate structure and no alicyclic structure, a polyol ingredient (B) having a (meth)acryloyl group and two or more hydroxyl groups in a molecule, and a polyisocyanate ingredient (C) together. The ingredient (A1) is selected from a diol (a1) having a carbonate structure and an alicyclic structure in a molecule, a combination of a diol (a2) having no alicyclic structure but having a carbonate structure, and a diol (a3) having no carbonate structure but having an alicyclic structure, and a combination of a diol (a1) and at least one of the diol (a2) and the diol (a3).

11 Claims, No Drawings

URETHANE RESIN, ACTINIC ENERGY RAY CURABLE ADHESIVE, AND BACK PROTECTIVE SHEET FOR SOLAR CELL

CROSS REFERENCE TO RELATED APPLICATIONS

This application is a Continuation Application of PCT Application No. PCT/JP2010/060057, filed Jun. 14, 2010 and based upon and claiming the benefit of priority from prior Japanese Patent Applications No. 2009-142475, filed Jun. 15, 2009; No. 2009-142476, filed Jun. 15, 2009; and No. 2009-279068, filed Dec. 9, 2009, the entire contents of all of which are incorporated herein by reference.

BACKGROUND OF THE INVENTION

1. Field of the Invention

The present invention relates to, for example, an actinic energy curable urethane resin suitably used as adhesives, inks, and coating materials. Particularly, the present invention relates to an actinic energy curable urethane resin suitably used as an actinic energy ray curable adhesive for forming a back protective sheet for a solar cell.

Further, the present invention relates to an actinic energy ray curable adhesive that makes it possible to produce a back protective sheet for a solar cell excellent in adhesion between sheet members and moist-heat resistance with high yields and high productivity at low cost.

2. Description of the Related Art

Recently, awareness of environmental concerns has been increasing, and solar cells attract attention as they are clean energy sources and do not cause environmental pollution. Since the solar cells allow solar energy, which is a substantially inexhaustible energy resource, to be used as electric energy, they have been intensively studied and already put into practical use.

In order to protect solar cell elements, a solar cell is provided with a back protective sheet on the surface opposite to the surface from which sunlight enters into the cell. The back protective sheet for a solar cell is required to deliver performance such as weather resistance, water vapor permeability, electrical insulation, mechanical characteristics or mounting workability.

As the back protective sheet for a solar cell, a sheet formed by stacking several sheet members is usually used. In the stacking of these sheet members, generally used is a polyurethane adhesive that contains a hydroxyl group-containing resin as a base resin and an isocyanate compound as a curing agent as described in Jpn. Pat. Appln. KOKAI Publication No. 2007-320218 and Jpn. Pat. Appln. KOKAI Publication No. 2007-253463.

When the back protective sheet for a solar cell is mass-produced, a plurality of sheet members are stacked to form a long laminate, and then the long laminate is wound into a roll. However, the curing reaction of the polyurethane-based adhesive is slow, and thus the stacked sheet members of the wound laminate are likely to slip with respect to each other. Thus, a process using a polyurethane adhesive has problems such as high rejection rate and low yield.

In order to allow the polyurethane-based adhesive to be sufficiently cured, the above-described laminate needs to be subjected to aging in a warehouse maintained at a high temperature over several days. Therefore, the process using the polyurethane-based adhesive has problems such as low productivity and requirement of electric costs for maintaining the temperature in the warehouse.

Further, the isocyanate compound, which is a curing agent, reacts with not only the hydroxyl group-containing resin, which is a base resin, but also water in the air. A product of addition reaction of the isocyanate compound with water causes decarboxylation, and thus air bubbles are generated in the adhesive layer after stacking the sheet member. Accordingly, the process using the polyurethane-based adhesive has problems such as appearance defects and delamination.

Jpn. Pat. Appln. KOKAI Publication No. 2008-127475 discloses an actinic energy ray curable resin adhesive prepared by reacting polycarbonatediol, a bifunctional epoxy (meth)acrylate having two hydroxyl groups and two ethylenically unsaturated groups in a molecule, and polyisocyanate with one another and mixing an unsaturated group-containing urethane resin thus obtained with a photopolymerization initiator. However, when this is used as an adhesive for a back protective sheet of a solar cell, the adhesion between the sheet members and moist-heat resistance are not sufficient.

BRIEF SUMMARY OF THE INVENTION

An object of the present invention is to provide an actinic energy ray curable composition that makes it possible to produce a back protective sheet for a solar cell excellent in adhesion between sheet members and moist-heat resistance with high yield and high productivity at low cost.

The first invention relates to a urethane resin (D) having (meth)acryloyl groups and prepared by reacting the following ingredients with one another: a diol ingredient (A1) having no (meth)acryloyl group and selected from the group consisting of a diol (a1) having a carbonate structure and an alicyclic structure in a molecule, a combination of a diol (a2) having no alicyclic structure but having a carbonate structure, and a diol (a3) having no carbonate structure but having an alicyclic structure, and a combination of a diol (a1) and at least one of the diol (a2) and the diol (a3); an optional diol ingredient (A2) having no (meth)acryloyl group, no carbonate structure and no alicyclic structure; a polyol ingredient (B) having a (meth)acryloyl group and two or more hydroxyl groups in a molecule; and a polyisocyanate ingredient (C).

The second invention relates to the urethane resin (D) according to the above-described invention, wherein the urethane resin (D) has a glass transition temperature of −60 to −10° C.

The third invention relates to the urethane resin (D) according to any one of the above-described inventions, wherein the number average molecular weight is within a range of 5,000 to 150,000.

The fourth invention relates to the urethane resin (D) according to any one of the above-described inventions, wherein the polyol ingredient (B) has two or more (meth)acryloyl groups in a molecule.

The fifth invention relates to the urethane resin (D) according to the fourth invention, wherein the polyol ingredient (B) is a compound obtained by adding (meth)acrylic acid to an epoxy group of a compound having two or more epoxy groups.

The sixth invention relates to the urethane resin (D) according to any one of the above-described inventions, wherein a (meth)acryloyl group equivalent is within a range of 500 to 40,000.

The seventh invention relates to an actinic energy ray curable adhesive comprising: the urethane resin (D) according to any one of the second to sixth invention; and an epoxy resin (E).

The eighth invention relates to the actinic energy ray curable adhesive according to the above-described invention, wherein the number average molecular weight of the epoxy resin (E) is within a range of 500 to 5,000.

The ninth invention relates to the actinic energy ray curable adhesive according to any one of the above-described inventions, wherein 5 to 40 parts by weight of the epoxy resin (E) is contained based on 100 parts by weight of the urethane resin (D).

The tenth invention relates to a back protective sheet for a solar cell comprising: an actinic energy ray-cured adhesive layer formed from the actinic energy ray curable adhesive according to any one of the above-described inventions; and two or more sheet members stacked together with the actinic energy ray-cured adhesive layer interposed therebetween.

The eleventh invention relates to the back protective sheet for a solar cell according to the above-described invention, wherein one of the sheet members is a metallic foil or a plastic film with a vapor-deposited layer formed by vapor-depositing a metal oxide or a nonmetallic inorganic oxide onto at least one of surfaces of the plastic film.

The twelfth invention relates to the back protective sheet for a solar cell according to any one of the above-described inventions, wherein the glass transition temperature of the actinic energy ray-cured adhesive layer is within a range of $-20$ to $20°$ C.

DETAILED DESCRIPTION OF THE INVENTION

Hereinafter, embodiments of the present invention will be described in detail.

A urethane resin (D) having (meth)acryloyl groups according to an embodiment of the present invention can be obtained by reacting a diol ingredient (A1) having no (meth)acryloyl group, an optional diol ingredient (A2) having no (meth)acryloyl group, no carbonate structure, and no alicyclic structure, a polyol ingredient (B) having a (meth)acryloyl group and two or more hydroxyl groups in a molecule, and a polyisocyanate ingredient (C) with one another. As will be described later, the diol ingredient (A1) is selected from a diol (a1) having a carbonate structure and an alicyclic structure in a molecule, a combination of two diols of a diol (a2) having no alicyclic structure but having a carbonate structure and a diol (a3) having no carbonate structure but having an alicyclic structure, and a combination of the diol (a1) with at least one of the diols (a2) and (a3).

In the description and claims, when a certain compound is represented using the wording "(meth)acrylo", this means that the compound may be either a compound which is read as "acrylo" instead of "(meth)acrylo" or a compound which is read as "methacrylo" instead of "(meth)acrylo". Moreover, in the description, when a certain functional group is represented using the wording "(meth)acryl", this means that the functional group may be either a functional group which is read as "acryl" instead of "(meth)acryl" or a functional group which is read as "methacryl" instead of "(meth)acryl". Furthermore, in the description, when a certain compound is represented using the wording "(meth)acrylate", this means that the compound is either a compound which is read as "acrylate" instead of "(meth)acrylate" or a compound which is read as "methacrylate" instead of "(meth)acrylate".

The glass transition temperature of the urethane resin (D) is preferably from $-60°$ C. to $-10°$ C., more preferably from $-50°$ C. to $-20°$ C. When the glass transition temperature is lower than $-60°$ C., adhesion between the sheet members is prone to be weakened during a moist-heat resistance test. When the glass transition temperature is higher than $-10°$ C., wettability of the adhesive on the sheet member tends to be poor when stacking the sheet members such that the curable adhesive layer or the cured adhesive layer is interposed therebetween. As a result, the adhesion between the sheet members is prone to be insufficient.

Note that the glass transition temperature of the urethane resin (D) was measured using a differential scanning calorimeter (DSC) "RDC220", manufactured by Seiko Instruments Inc. Specifically, a urethane resin solution was dried to prepare a sample, and about 10 mg of the sample was weighed in an aluminum pan. Then, the sample was set in a differential scanning calorimetry (DSC) analyzer and cooled to $-100°$ C. Thereafter, the temperature of the sample was increased at $10°$ C./min and the glass transition temperature was calculated from the obtained DSC chart in the process.

The number average molecular weight (Mn) of the urethane resin (D) is preferably within a range of 5,000 to 150,000, more preferably within a range of 10,000 to 100,000. When the number average molecular weight is lower than 5,000, cohesive force of the cured adhesive layer may be insufficient and the adhesion between the sheet members is likely to be weakened during the moist-heat resistance test. When the number average molecular weight is greater than 150,000, this may cause problems that the viscosity of the actinic energy ray curable adhesive becomes high, solubility with other ingredients constituting the actinic energy ray curable adhesive is low, or wettability of the adhesive on the sheet member is poor when stacking the sheet members with the curable adhesive layer or the cured adhesive layer interposed therebetween and, as a result, the adhesion between the sheet members becomes insufficient.

From the viewpoint of coexistence of the adhesion between the sheet members and moist-heat resistance, a (meth)acryloyl group equivalent of the urethane resin (D) is preferably within a range of 500 to 40,000, more preferably within a range of 1,000 to 30,000. The term "(meth)acryloyl group equivalent" used herein means a value obtained by dividing the number average molecular weight of the urethane resin (D) by an average of the number of (meth)acryloyl groups contained in a molecule of the urethane resin (O).

When the (meth)acryloyl group equivalent is lower than 500, the adhesion between the sheet members is likely to become insufficient due to cure shrinkage during curing with actinic energy rays. On the other hand, when the (meth)acryloyl group equivalent is larger than 40,000, cross-linking of the adhesive becomes insufficient and the adhesion between the sheet members tends to be reduced during the moist-heat resistance test.

From the viewpoint of the adhesion between the sheet members and moist-heat resistance, the urethane bond equivalent thereof is preferably within a range of 200 to 3,000, more preferably within a range of 250 to 2,000. The term "urethane bond equivalent" used herein means a value obtained by dividing the number average molecular weight of the urethane resin (D) by an average of the number of urethane bonds contained in a molecule of the urethane resin (D).

When the urethane bond equivalent is lower than 200, the cohesive force of the curable adhesive layer or the cured adhesive layer is high. Accordingly, wettability of the adhesive on the sheet member tends to be poor when stacking the sheet members with the curable adhesive layer or the cured adhesive layer interposed therebetween and the adhesion between the sheet members is likely to become insufficient. On the other hand, when the urethane bond equivalent is larger than 3,000, a few urethane bonds, which offer good moist-heat resistance, are formed and the adhesion between the sheet members tends to be reduced after the moist-heat resistance test.

The diol ingredient (A1), which is used for forming the urethane resin (D) and has no (meth)acryloyl group, is selected from the group consisting of a diol (a1) having a carbonate structure and a alicyclic structure in a molecule; a combination of a diol (a2) having no alicyclic structure but having a carbonate structure and a diol (a3) having no carbonate structure but having an alicyclic structure; and a combination of the diol (a1) and at least one of the diols (a2) and (a3).

The carbonate structure is a structure containing a carbonate group (—O—CO—O-group). The urethane resin (D) contains a carbonate group originated from the diol ingredient (A1).

In the urethane resin (D), the concentration of a carbonate group relative to the total solid content of the diol ingredient (A1), the diol ingredient (A2) which can be used when necessary, the polyol ingredient (B), and the polyisocyanate ingredient (C) is preferably from 2 to 8 mmol/g, more preferably from 3 to 7 mmol/g. The term "concentration of a carbonate group" herein means an amount of the carbonate group per 1 g of solid content of the total of the diol ingredient (A1), the diol ingredient (A2) which can be used when necessary, the polyol ingredient (B), and the polyisocyanate ingredient (C). When this concentration is lower than 2 mmol/g, solubility of the urethane resin in the solvent is deteriorated or sufficient moist-heat resistance tends not to be obtained. When this concentration is higher than 8 mmol/g, sufficient adhesion tends not to be obtained.

The alicyclic structure is a structure including a carbon ring not having aromaticity. The urethane resin (D) contains a carbon ring originated from the diol ingredient (A1). As the carbon ring, a cyclohexane skeleton, which is a six membered-ring, is preferred.

In the urethane resin (D), the concentration of an alicyclic skeleton originated from the diol ingredient (A1) relative to the total solid content of the diol ingredient (A1), the diol ingredient (A2) which can be used when necessary, the polyol ingredient (B), and the polyisocyanate ingredient (C) is preferably from 0.05 to 5 mmol/g, more preferably from 0.1 to 4.5 mmol/g. The term "concentration of the alicyclic skeleton originated from the diol ingredient (A1)" herein means an amount of the alicyclic skeleton originated from the diol ingredient (A1) per 1 g of solid content of the total of the diol ingredient (A1), the diol ingredient (A2) which can be used when necessary, the polyol ingredient (B), and the polyisocyanate ingredient (C). When this concentration is lower than 0.05 mmol/g, sufficient moist-heat resistance tends not to be obtained. When this concentration is higher than 5 mmol/g, sufficient adhesion tends not to be obtained.

The diol (a1) having a carbonate structure and an alicyclic structure in a molecule is obtained by, for example, using at least one diol not having a carbonate structure but having an alicyclic structure and ester carbonate as raw materials and causing an ester exchange reaction. Usable examples of the diol having no carbonate structure but having an alicyclic structure include 1,3-cyclohexanediol, 1,4-cyclohexanediol, 1,4-cyclohexane dimethanol, 2-bis(4-hydroxycyclohexyl)-propane, hydrogenated bisphenol A, hydrogenated bisphenol F or a combination of two or more of these compounds. In the ester exchange reaction, the diol having no carbonate structure but having an alicyclic structure may be used in combination with the diol which has neither a carbonate structure nor an alicyclic structure. Usable examples of the diol not having a carbonate structure and an alicyclic structure include ethylene glycol, 1,3-propanediol, 1,4-butanediol, 1,5-pentanediol, 1,6-hexandiol, 1,7-heptane diol, 1,8-octanediol, 1,9-nonanediol, 1,10-decanediol, 1,5-hexandiol, 2-methyl-1,8-octanediol, neopentyl glycol, 2-isopropyl-1,4-butanediol, 2-ethyl-1,6-hexandiol, 3-methyl-1,5-pentanediol, 2,4-dimethyl-1,5-pentanediol, 2,4-diethyl-1,5-pentanediol, 1,3-butanediol, 2-ethyl-1,3-hexandiol, 2-butyl-2-ethyl-1,3-propanediol, or a combination of two or more of those compounds. It is possible to use polycarbonatediol having an alicyclic structure, for example, a diol obtained by causing copolymerization of the diol having no carbonate structure but having an alicyclic structure with caprolactone. Examples of the diol ingredients include ETERNACOLL UC-100, ETERNACOLL UM-90 (3/1), ETERNACOLL UM-90 (1/1), ETERNACOLL UM-90 (1/3), manufactured by UBE INDUSTRIES, LTD. These may be used alone or in combination of two or more of them.

A diol ingredient (a2) having no alicyclic structure but having a carbonate structure is obtained by, for example, using at least one diol having neither a carbonate structure nor an alicyclic structure and ester carbonate as raw materials and causing an ester exchange reaction. Usable examples of the diol not having a carbonate structure and an alicyclic structure include ethylene glycol, 1,3-propanediol, 1,4-butanediol, 1,5-pentanediol, 1,6-hexandiol, 1,7-heptane diol, 1,8-octanediol, 1,9-nonanediol, 1,10-decanediol, 1,5-hexandiol, 2-methyl-1,8-octanediol, neopentyl glycol, 2-isopropyl-1,4-butanediol, 2-ethyl-1,6-hexandiol, 3-methyl-1,5-pentanediol, 2,4-dimethyl-1,5-pentanediol, 2,4-diethyl-1,5-pentanediol, 1,3-butanediol, 2-ethyl-1,3-hexandiol, 2-butyl-2-ethyl-1,3-propanediol, or a combination of two or more of those compounds. It is possible to use polycarbonatediol having no alicyclic structure, for example, a diol obtained by copolymerization of the diol having neither a carbonate structure nor an alicyclic structure with caprolactone. Examples of such a diol ingredient include C-1090, C-2050, C-2090 and C-3090, (manufactured by Kuraray Co., Ltd.); ETERNACOLL UH-50, ETERNACOLL UH-100, ETERNACOLL UH-200, ETERNACOLL UH-300, ETERNACOLL UH-50-200 and ETERNACOLL UH-50-100 (manufactured by UBE INDUSTRIES, LTD); T6002, T6001, T5652 and T4672 (manufactured by Asahi Kasei Chemicals Corporation); and PLACCELCD CD205, PLACCELCD CD205PL, PLACCELCD CD210, PLACCELCD CD210PL, PLACCELCD CD220 and PLACCELCD CD220PL (manufactured by DAICEL CHEMICAL INDUSTRIES, LTD.). These may be used alone or in combination of two or more of them.

Examples of a diol ingredient (a3) having no carbonate structure but having an alicyclic structure include 1,3-cyclohexanediol, 1,4-cyclohexanediol, 1,4-cyclohexane dimethanol, 2-bis(4-hydroxycyclohexyl)-propane, hydrogenated bisphenol A, and hydrogenated bisphenol F. These may be used alone or in combination of two or more of them.

The diol ingredient (A1) may be used in combination with the diol ingredient (A2) which does not have any of the (meth)acryloyl group, the carbonate structure, and the alicyclic structure. Although the diol ingredient (A2) can be omitted, the diol ingredient (A2) can be used for adjusting the glass transition temperature of the urethane resin (D).

Examples of the diol ingredient (A2) include so-called prepolymers such as polyesterdiol, polyethylene glycol, and polypropylene glycol; and ethylene glycol, diethylene glycol, triethylene glycol, propylene glycol, dipropylene glycol, 1,6-hexandiol, neopentyl glycol, 1,4-butylene glycol, 1,9-nonanediol, and 3-methyl-1,5-pentanediol. These may be used alone or in combination of two or more of them.

When the diol ingredient (A1) is used in combination with the diol ingredient (A2), a percentage of the diol ingredient (A2) in the total amount of them is preferably 20% by weight or less, more preferably 10% by weight or less. When this percentage is large, an effect of a polycarbonate skeleton and an alicyclic skeleton on moist-heat resistance and adhesion is reduced and it tends to be difficult to balance excellent moist-heat resistance and excellent adhesion.

The polyol ingredient (B) having a (meth)acryloyl group to be used as a raw material of the urethane resin (D) has two or more hydroxyl groups. The use of the polyol ingredient (B) allows the (meth)acryloyl group to be introduced into the urethane resin (D) not only at an end of its main chain but also at a side chain thereof. The introduction amount of the (meth)acryloyl group can be controlled by controlling the compositions of the diol ingredients (A1) and (A2) and the polyol ingredient (B).

Examples of the polyol ingredient (B) containing a (meth)acryloyl group and two or more hydroxyl groups in a molecule include a compound (B1) obtained by adding (meth)acrylic acid to an epoxy group of a compound having two or more epoxy groups, glycerin mono(meth)acrylate, trimethylol ethane mono(meth)acrylate, trimethylol propane mono(meth)acrylate, pentaerythritol mono(meth) acrylate, pentaerythritol di(meth)acrylate, dipentaerythritol tetra(meth)acrylate, and dipentaerythritol tri(meth)acrylate. These may be used alone or in combination of two or more of them.

Examples of the compound (B1) obtained by adding (meth)acrylic acid to an epoxy group of a compound having two or more epoxy groups include (meth)acrylic acid adduct of propylene glycol diglycidyl ether, (meth)acrylic acid adduct of 1,6-hexanediol diglycidyl ether, (meth)acrylic acid adduct of ethylene glycol diglycidyl ether, (meth)acrylic acid adduct of 1,4-butanediol diglycidyl ether, (meth)acrylic acid adduct of 1,5-pentanediol diglycidyl ether, (meth)acrylic acid adduct of 1,6-hexanediol diglycidyl ether, (meth)acrylic acid adduct of 1,9-nonanediol diglycidyl ether, (meth)acrylic acid adduct of neopentyl glycol diglycidyl ether, (meth)acrylic acid adduct of bisphenol A diglycidyl ether, (meth)acrylic acid adduct of hydrogenated bisphenol A diglycidyl ether, and (meth)acrylic acid adduct of glycerin diglycidyl ether.

Examples of the polyisocyanate ingredient (C) to be used as a raw material of the urethane resin (D) include diisocyanates such as 2,4-tolylene diisocyanate, 2,6-tolylene diisocyanate, xylylene diisocyanate, diphenylmethane diisocyanate, isophorone diisocyanate, 1,5-naphthalene diisocyanate, hexamethylene di-isocyanate, and hydrogenated diphenylmethane diisocyanate. These may be used alone or in combination of two or more of them. From the viewpoint of weather resistance, preferable diisocyanate is cycloaliphatic diisocyanate.

The urethane resin (D) may be produced by reacting raw materials in the absence of a solvent or may be produced by reacting them in an organic solvent.

Examples of the organic solvent include various solvents such as ketones such as acetone, methyl ethyl ketone, methyl isobutyl ketone, and cyclohexanone; esters such as methyl acetate, ethyl acetate, butyl acetate, ethyl lactate, methoxyethyl acetate; ethers such as diethylether and ethyleneglycol dimethyl ether; aromatic compounds such as toluene and xylene; aliphatic compounds such as pentane and hexane; and halogenated hydrocarbons such as methylene chloride, chlorobenzene, and chloroform.

If necessary, a catalyst can be added to the organic solvents. Examples of the catalyst include metal-based catalysts such as dibutyltin diacetate, dibutyltin dilaurate, dioctyltin dilaurate, dibutyltin dimalate; tertiary amines such as 1,8-diazabicyclo(5,4,0)undecene-7,1,5-diazabicyclo(4,3,0)nonene-5,6-dibutylamino-1,8-diazabicyclo(5,4,0)undecene-7; and reactive tertiary amines such as triethanolamine. These may be used alone or in combination of two or more of them.

Subsequently, the actinic energy ray curable adhesive according to an embodiment of the present invention will be described.

The actinic energy ray curable adhesive according to an embodiment of the present invention is one of the urethane resins (D) having a glass transition temperature of −60 to −10° C. or contains an epoxy resin (E).

Examples of the epoxy resin (E) include glycidyl ether compounds such as bisphenol A type epoxy resins, bisphenol F type epoxy resins, bisphenol S type epoxy resins, brominated bisphenol A type epoxy resins, hydrogenated bisphenol A type epoxy resins, biphenol type epoxy resins, bixylenol type epoxy resins, phenol novolak type epoxy resins, cresol novolak type epoxy resins, brominated phenol novolak type epoxy resins, bisphenol A novolak type epoxy resins, trihydroxyphenyl methane type epoxy resins, tetraphenylol ethane type epoxy resins, naphthalene skeleton-containing phenol novolak type epoxy resins, and dicyclopentadiene skeleton-containing phenol novolak type epoxy resins; glycidyl ester compounds such as diglycidyl terephthalate; alicyclic epoxy resins represented by EHPE-3150 (manufactured by DAICEL CHEMICAL INDUSTRIES, LTD.); heterocyclic epoxy resins such as triglycidyl isocyanurate; epoxy compounds such as glycidylamines including N,N,N',N'-tetraglycidyl methaxylene diamine or copolymers of glycidyl (meth)acrylate and a compound containing an ethylenically unsaturated double bond. These may be used alone or in combination of two or more of them.

When an epoxy resin is contained in the actinic energy ray curable adhesive, a functional group generated by decomposition of the urethane resin during a moist-heat resistance test can be reacted with the epoxy group. Thus, the reduction in molecular weight of the adhesives layer can be suppressed and the reduction in adhesiveness can be suppressed.

From the viewpoint of moist-heat resistance of the adhesives layer and compatibility with the urethane resin (D), the epoxy resin (E) is preferably a bisphenol type epoxy resin having a number average molecular weight of 500 to 5,000. When the number average molecular weight of the epoxy resin is less than 500, the adhesive layer is soft, sufficient moist-heat resistance tends not to be obtained. When the number average molecular weight of the epoxy resin is more than 5,000, compatibility of the actinic energy ray curable adhesive with other ingredients is low and the adhesive tends to become cloudy.

This actinic energy ray curable adhesive can contain an aziridine-based compound (F). When the actinic energy ray curable adhesive contains the aziridine-based compound (F), a covalent bond between the sheet member and the aziridine compound can be formed, thereby improving adhesion between the sheet members.

Examples of the aziridine-based compound (F) include 2,2-bis-hydroxymethylbutanol-tris[3-(1-aziridinyl)propionate] and 4,4-bis(ethylene imino carbonylamino)diphenyl methane. These may be used alone or in combination of two or more of them.

A solar cell module has various configurations depending on the product on which the solar cell module is mounted or the use thereof. The back protective sheet to be used can be suitably selected depending on the product on which the solar cell module is mounted or the use thereof. When the size of the adhesion between the sheet members is not considered to be very important, the actinic energy ray curable adhesive may not contain the aziridine-based compound (F).

The actinic energy ray curable adhesive can further contain a compound having a (meth)acryloyl group other than the urethane resin (D). Examples of the compound having a (meth)acryloyl group other than the urethane resin (D) include (meth)acrylate monomers having a relatively low molecular weight, prepolymers having a certain molecular weight, and polymers.

Examples of the (meth)acrylate monomers with a relatively low molecular weight include monofunctional (meth)acrylate monomers such as 4-hydroxybutyl (meth)acrylate, isobornyl (meth)acrylate, lauryl (meth)acrylate, and acryloyl morpholine; and multifunctional (meth)acrylate monomers such as 1,9-nonanediol-di(meth)acrylate, bisphenol-A di(meth)acrylate, pentaerythritol tri(meth)acrylate, tris((meth)acryloxyethyl)isocyanurate, and dipentaerythritol hexa(meth)acrylate.

Examples of the prepolymer and polymer include radical polymerizable prepolymers having a (meth)acryloyl group such as polyester (meth)acrylate, polyurethane (meth)acrylate, epoxy (meth)acrylate, and (meth)acrylated maleic acid-modified polybutadiene.

These may be used alone or in combination of two or more of them.

This actinic energy ray curable adhesive can contain a photopolymerization initiator and a compound not having actinic energy ray curability.

As the photopolymerization initiator, publicly-known photopolymerization initiators can be used. Usable examples of the photopolymerization initiator include benzophenone, 1-hydroxycyclohexyl phenyl ketone, 2,2-dimethoxy-1,2-diphenylethanel-one, 2,4,6-trimethylbenzoyl diphenylphosphine oxide, 2-benzyl-2-dimethylamino-1-(4-morpholinophenyl)butanone-1,2-hydroxy-2-methyl-1-phenylpropane-1-one, 2-methyl-1-(4-methylthio phenyl)-2-morpholinopropane-1-one, benzoin methyl ether, benzoin ethyl ether, benzoin isobutyl ether, benzoin isopropyl ether, bis(2,4,6-trimethylbenzoyl)-phenylphosphine oxide, 2-hydroxy-2-methyl-(4-(1-methylvinyl)phenyl)propanol oligomer, isopropylthioxantone, (4-(methylphenylthio)phenyl) phenylmethane, 2,4-diethylthioxanthone, 2-chlorothioxanthone, ethylanthraquinone, or a combination of two or more of these compounds.

As a sensitizer, aliphatic amines such as n-butylamine, triethylamine, and ethyl p-dimethylaminobenzoate or aromatic amine may be used together with the photopolymerization initiators.

This actinic energy ray curable adhesive can further contain other compounds not having actinic energy ray curability. Examples of the compounds not having actinic energy ray curability include resins such as acrylate resins, polyester resins, amino resins, xylene resins, and petroleum resins; curing agents such as isocyanate compounds; aluminum chelate compounds, silane coupling agents, ultraviolet absorbers, antioxidants, leveling agents, defoaming agents, bonding aids, dispersants, dry regulators, abrasion agents or a combination of two or more of these compounds.

This actinic energy ray curable adhesive contains preferably 50 to 85% by weight of the urethane resin (D), 2.5 to 34% by weight of the epoxy resin (E), 0 to 10% by weight of the aziridine-based compound (F), and 0 to 30% by weight of the compound having a (meth)acryloyl group other than the urethane resin (D) based on the solid content of the actinic energy ray curable adhesive, more preferably 60 to 85% by weight of the urethane resin (D), 10 to 34% by weight of the epoxy resin (E), 0 to 5% by weight of the aziridine-based compound (F), and 0 to 15% by weight of the compound having a (meth)acryloyl group other than the urethane resin (D).

When the content of the urethane resin (D) is less than 50% by weight, cohesive force of the adhesive layer becomes low and the adhesion and moist-heat resistance tend to be insufficient. When the content of the urethane resin (D) is more than 85% by weight, the moist-heat resistance tends to be reduced.

When the content of the epoxy resin (E) is less than 2.5% by weight, an effect of improving the moist-heat resistance tends to be hardly obtained. When the content of the epoxy resin (E) is more than 34% by weight, the crosslinking density of the adhesive layer is reduced and thus the moist-heat resistance tends to be reduced.

When the content of the aziridine-based compound (F) is more than 10% by weight, the moist-heat resistance tends to be reduced.

When the content of the compound having a (meth)acryloyl group other than the urethane resin (D) is more than 30% by weight, the adhesion is likely to become insufficient due to shrinkage during curing.

An actinic energy ray-cured adhesive layer constituting a part of the back protective sheet for a solar cell according to one embodiment of the present invention has preferably a glass transition temperature of −20° C. to 20° C. In other words, when the actinic energy ray curable adhesive is cured by irradiation with actinic energy rays, the adhesive preferably forms an adhesive layer having a glass transition temperature of −20° C. to 20° C.

When the glass transition temperature is more than 20° C., wettability of the adhesive on the sheet member tends to be poor when stacking the sheet members with the curable adhesive layer or the cured adhesive layer interposed therebetween. As a result, the adhesion between the sheet members is likely to become insufficient. On the other hand, when the glass transition temperature is lower than −20° C., the cohesive force of the adhesive layer is low and the adhesion and moist-heat resistance is likely to become insufficient.

The back protective sheet for a solar cell according to an embodiment of the present invention is formed by stacking two or more sheet members such that the actinic energy ray-cured adhesive layer formed from the actinic energy ray curable adhesive is interposed therebetween.

The sheet member for constituting a part of the back protective sheet for a solar cell is not particularly limited. Examples of the sheet member include plastic films, metallic foils or films obtained by vapor-depositing a metal oxide or a nonmetallic oxide onto a plastic film.

Examples of the plastic films include polyester-based resin films made of polyesters such as polyethylene terephthalate and polynaphthalene terephthalate; polyethylene-based resin films; polypropylene-based resin films; polyvinyl chloride-based resin films; polycarbonate-based resin films; polysulfone-based resin films; poly(meth)acrylic-based resin films; and fluorine-based resin films made of fluorine resins such as polyvinyl fluoride, polyvinylidene fluoride, polychlorotrifluoroethylene resin, polyethylene tetrafluoroethylene, polytetrafluoroethylene, a tetrafluoroethylene perfluoroalkyl vinyl ether copolymer, and a tetrafluoroethylene hexafluoropropylene copolymer.

In place of a plastic film having a single layer structure, a plastic film having a multilayer structure may be used. For example, a film formed by coating the above plastic film with an acrylic or fluorine coating material, or a multilayer film including a stack of polyvinylidene fluoride, an acrylic resin or the like formed by co-extruding may be used. Alternatively, a sheet member formed by laminating a plurality of the plastic films through a urethane-based adhesive layer may be used.

As the metallic foil, for example, an aluminum foil can be used.

Examples of the metal oxide or nonmetallic inorganic oxide to be vapor-deposited include oxides of silicon, aluminum, magnesium, calcium, potassium, tin, sodium, boron, titanium, lead, zirconium, yttrium, etc.

Among them, the polyester-based resin films such as polyethylene terephthalate and polynaphthalene terephthalate or the polycarbonate-based resin films, which have resistance to temperatures, are preferably used from viewpoints of weather resistance, water vapor permeability, electrical insulation, mechanical characteristics, mounting workability, etc. when used in a solar cell module. From the viewpoint of preventing power reduction of the solar cell due to water, it is preferable to use a plastic film on which a metal oxide or a nonmetallic inorganic oxide having water vapor barrier properties is vapor-deposited or a metallic foil such as aluminum foil. From the viewpoint of preventing appearance defects caused by photo-deterioration, the fluorine-based resin film with good weather resistance is preferably used. When these films are stacked, particularly an excellent back protective sheet for a solar cell is obtained.

The back protective sheet for a solar cell according to an embodiment of the present invention can be obtained, for example, by the methods [1] to [3] below.

[1] A certain sheet member is coated with the actinic energy ray curable adhesive and another sheet member is stacked on the layer of the actinic energy ray curable adhesive thus formed. Then, this stack is irradiated with the actinic energy rays from a side of one of the sheet members or from the respective sides of the sheet members to form an actinic energy ray-cured adhesive layer between these sheet members.

[2] A certain sheet member is coated with the actinic energy ray curable adhesive to form a layer of the actinic energy ray curable adhesive. Then, the resultant structure is irradiated with actinic energy rays from the side of the actinic energy ray curable adhesive layer and/or from the side of the sheet member to form an actinic energy ray-cured adhesive layer. Thereafter, another sheet member is stacked on the actinic energy ray-cured adhesive layer.

[3] A certain sheet member is coated with actinic energy ray curable adhesive to form a layer of the actinic energy ray curable adhesive. Then, the resultant structure is irradiated with actinic energy rays from the side of the actinic energy ray curable adhesive layer and/or from the side of the sheet member to form an actinic energy ray-cured adhesive layer. Thereafter, the actinic energy ray-cured adhesive layer is coated with another coating liquid for forming sheet members and exposed to heat or actinic energy rays to form another sheet member.

Examples of another coating liquid for forming sheet members which is used in the method [3] include polyester-based resin solutions, polyethylene-based resin solutions, polypropylene-based resin solutions, polyvinyl chloride-based resin solutions, polycarbonate-based resin solutions, polysulfone-based resin solutions, poly(meth)acrylic-based resin solutions, and fluorine-based resin solutions which may be used to form plastic films.

In the method [1], the irradiation with actinic energy rays is performed in a state that the actinic energy ray curable adhesive layer is sandwiched between two sheet members. Accordingly, the method [1] has an advantage that when the actinic energy ray curable adhesive is radically polymerizable, oxygen inhibition during curing is hardly caused. However, on the other hand, the layer of the actinic energy ray curable adhesive is irradiated with actinic energy rays through the sheet member. Thus, irrespective of the fact that the actinic energy ray curable adhesive is radically polymerizable, it is important to use a sheet member capable of transmitting actinic energy rays without attenuating it as much as possible.

The method [2] has characteristics different from the method [1]. Specifically, in the method [2], the irradiation with actinic energy rays is performed in the state where the oxygen inhibition is likely caused. However, on the other hand, the method [2] has an advantage of a wide choice of the sheet member.

In the method [3], the irradiation with actinic energy rays is performed in a first process in the state where the oxygen inhibition is likely caused. However, on the other hand, the method [3] has an advantage that since the adhesive layer thus formed is coated with another coating liquid for forming sheet members to form another sheet member, the adhesion between the adhesive layer and another sheet member is likely to be ensured.

Taking into consideration the performance, price, and productivity required for the back protective sheet of a solar cell, various production methods can be selected or combined.

In the case of the method [1] or [2], another sheet member can be stacked on the curable adhesive layer or the cured adhesive layer under heating and/or pressurizing conditions.

The actinic energy ray curable adhesive may contain a solvent within a range that does not influence the sheet member in a drying process in order to adjust its viscosity to a viscosity suitable for applying it to the sheet member. When the actinic energy ray curable adhesive includes the solvent, the actinic energy ray curable adhesive can be cured by irradiating with actinic energy rays after vaporizing the solvent.

Examples of the solvent include ketones such as acetone, methyl ethyl ketone, methyl isobutyl ketone, and cyclohexanone; esters such as methyl acetate, ethyl acetate, butyl acetate, ethyl lactate, methoxyethyl acetate; ethers such as diethylether and ethyleneglycol dimethyl ether; aromatic compounds such as toluene and xylene; aliphatic compounds such as pentane and hexane; halogenated hydrocarbon compounds such as methylene chloride, chlorobenzene, and chloroform; alcohols such as ethanol, isopropyl alcohol, and normalbutanol; and water. These solvents may be used alone or in combination of two or more of them.

Examples of an apparatus for coating the sheet member with the actinic energy ray curable adhesive include comma coaters, dry laminators, roll knife coaters, die coaters, roll coaters, bar coaters, gravure roll coaters, reverse roll coaters, blade coaters, gravure coaters, and micro gravure coaters.

The amount of adhesive to be applied to the sheet member is preferably from about 0.1 to 50 $g/m^2$ in dry film thickness.

Examples of actinic energy rays being irradiated to cure the actinic energy ray curable adhesive include ultraviolet rays, electron rays, y-rays, infrared rays, and visible rays.

Although examples of the present invention will be described below, the present invention is not limited thereto. Parts and percentage in the examples are parts by weight and percent by weight, respectively.

First, a method of synthesizing a urethane resin, a method of preparing an actinic energy ray curable adhesive, and a method of preparing a back protective sheet for a solar cell will be described.

Synthesis of Urethane Resin

Example 1

716.6 parts of methyl ethyl ketone (MEK), 607.8 parts of Kuraray polyol C-1090 (manufactured by Kuraray Co., Ltd.), 89.2 parts of cyclohexane dimethanol (CHDM), and 19.6 parts of Epoxy ester 70PA which was a compound obtained by adding 2 moles of acrylic acid to propylene glycol diglycidyl ether (manufactured by Kyoeisha Chemical Co., Ltd.) were poured into a polymerization tank of a polymerization reactor that included the polymerization tank, stirrer, thermometer, reflux condenser, nitrogen-introducing tube, and dropping tank. The temperature in the polymerization tank was increased to 80° C. while stirring the mixed solution under nitrogen gas stream. When the temperature reached 80° C., 0.5 part of dibutyltin dilaurate (DBTDL) was added to the polymerization tank.

Subsequently, a mixture of 283.4 parts of isophorone diisocyanate (IPDI) and 283.4 parts of MEK was dropped from the dropping tank into the polymerization tank over 2 hours. After 1 hour of the end of dropping, 0.05 part of DBTDL was added to the polymerization tank, followed by continuation of the reaction until the disappearance of the infrared absorption peak of the isocyanate group was observed by an infrared spectrophotometer. When complete disappearance of the absorption peak of the isocyanate group was confirmed, the reaction was terminated. The temperature of the polymerization tank was decreased to 40° C. and 500.0 parts of MEK were added to the polymerization tank to obtain a urethane resin solution (D-1) with a solid content of 40%. The properties of the urethane resin solution (D-1) are shown in Table 1.

Examples 2 to 22

Urethane resin solutions (D-2) to (D-22) were obtained in the same manner as Example 1 in accordance with the composition shown in Tables 1 to 4. The properties of the urethane resin solutions are shown in Tables 1 to 4.

Comparative Example 1

869.4 parts of methyl ethyl ketone (MEK), 834.1 parts of Kuraray polyol C-3090 (manufactured by Kuraray Co., Ltd.), and 41.7 parts of cyclohexane dimethanol (CHDM) were poured into the polymerization tank of the polymerization reactor that included the polymerization tank, stirrer, thermometer, reflux condenser, nitrogen-introducing tube, and dropping tank. The temperature in the polymerization tank was increased to 80° C. while stirring the mixed solution under nitrogen gas stream. When the temperature reached 80° C., 0.5 part of dibutyltin dilaurate (DBTDL) was added to the polymerization tank.

Subsequently, a mixture of 124.2 parts of isophorone diisocyanate (IPDI) and 124.2 parts of MEK was dropped from the dropping tank into the polymerization tank over 2 hours. After 1 hour of the end of dropping, 0.05 part of DBTDL was added to the polymerization tank, followed by continuation of the reaction until the disappearance of the infrared absorption peak of the isocyanate group was observed by an infrared spectrophotometer. When complete disappearance of the absorption peak of the isocyanate group was confirmed, a urethane resin with a number average molecular weight of 44,000, a weight average molecular weight of 76,000, and a hydroxyl value of 2.55 mgKOH/g was obtained.

Then, the temperature of the polymerization tank was decreased to 60° C. and a mixture of 2-acryloyloxyethyl isocyanate having an isocyanate group and an acryloyl group (KARENZ AOI, manufactured by Showa Denko K. K.) and 6.4 parts of MEK was added to the polymerization tank. Reaction was performed at 60° C. and continued until the complete disappearance of the infrared absorption peak of the isocyanate group was observed by the infrared spectrophotometer. Thereafter, the temperature in the polymerization tank was decreased to 40° C. and 500.0 parts of MEK were added to the polymerization tank to obtain a urethane resin solution (D-23) with a solid content of 40%. The properties of the urethane resin solution (D-23) are shown in Table 5.

Comparative Example 2

862.5 parts of methyl ethyl ketone (MEK), 826.7 parts of Kuraray polyol C-3090 (manufactured by Kuraray Co., Ltd.), and 41.3 parts of cyclohexane dimethanol (CHDM) were poured into the polymerization tank of the polymerization reactor that included the polymerization tank, stirrer, thermometer, reflux condenser, nitrogen-introducing tube, and dropping tank. The temperature in the polymerization tank was increased to 80° C. while stirring the mixed solution under nitrogen gas stream. When the temperature reached 80° C., 0.5 part of dibutyltin dilaurate (DBTDL) was added to the polymerization tank. Subsequently, a mixture of 132.0 parts of isophorone diisocyanate (IPDI) and 132.0 parts of MEK was dropped from the dropping tank into the polymerization tank over 2 hours. After 1 hour of the end of dropping, 0.05 parts of DBTDL was added to the polymerization tank. The reaction was continued for 3 hours to obtain a urethane resin with a number average molecular weight of 42,000, a weight average molecular weight of 72,000, and an NCO value of 2.67 mgKOH/g.

Then, the temperature in the polymerization tank was decreased to 60° C. and a mixture of 5.5 parts of hydroxyethyl acrylate (HEA) and 5.5 parts of MEK was added to the polymerization tank. Reaction was performed at 60° C. and continued until the complete disappearance of the infrared absorption peak of the isocyanate group was observed by the infrared spectrophotometer. Thereafter, the temperature of the polymerization tank was decreased to 40° C. and 500.0 parts of MEK were added to the polymerization tank to obtain a urethane resin solution (D-24) with a solid content of 40%. The properties of the urethane resin solution (D-24) are shown in Table 5.

Comparative Examples 3 to 5

Urethane resin solutions (D-25) to (D-27) were obtained in the same manner as Example 1 in accordance with the composition shown in Table 5. The properties of these urethane resin solutions are shown in Table 5.

<Number Average Molecular Weight (Mn) and Weight Average Molecular Weight (Mw)>

Measurement of the number average molecular weight and the weight average molecular weight was performed using gel permeation chromatography (GPC), "HPC-8020", manufactured by TOSOH CORPORATION and a solvent of tetrahydrofuran. The number average molecular weight and the weight average molecular weight were measured in polystyrene equivalent.

<Glass Transition Temperature (Tg)>

Measurement of the glass transition temperature was performed using DSC "RDC220", manufactured by Seiko Instruments Inc. Specifically, for each of samples obtained by drying the urethane resin solutions (D-1) to (D-27), about 10 mg was weighed in an aluminum pan. The sample was set in a DSC apparatus and cooled to −100° C. using liquid nitrogen, followed by increasing the temperature at 10° C./rain. The glass transition temperature was calculated from the obtained DSC chart in the process.

TABLE 1

| Process | Raw material | | | | Examples 1 D-1 | 2 D-2 | 3 D-3 | 4 D-4 | 5 D-5 | 6 D-6 |
|---|---|---|---|---|---|---|---|---|---|---|
| Polymerization tank | | MEK | | | 716.6 | 823.8 | 819.4 | 868.7 | 833.5 | 820.7 |
| | Diol ingredient (a2), etc. | C-1090 | Polycarbonate | Mn = 1000 | 607.8 | — | — | — | — | — |
| | | C-2050 | Polycarbonate | Mn = 2000 | — | 746.0 | 742.1 | 821.9 | 776.1 | — |
| | | C-2090R | Polycarbonate | Mn = 2000 | — | — | — | — | — | 742.5 |
| | | C-3090 | Polycarbonate | Mn = 3000 | — | — | — | — | — | — |
| | | P-3010 | Polyester | Mn = 3000 | — | — | — | — | — | — |
| | Diol ingredient (a3) | CHDM | | | 89.2 | 54.1 | 53.8 | 20.3 | 19.2 | 54.4 |
| | | RIKABINOL HB | | | — | — | — | — | — | — |
| | Polyol ingredient (B) | Epoxy ester 70PA | | | 19.6 | 23.7 | 23.6 | — | — | 23.8 |
| | | Epoxy ester 3000A | | | — | — | — | 26.5 | — | — |
| | | BLEMMER GML | | | — | — | — | — | 38.2 | — |
| | | Epoxy ester 80MFA | | | — | — | — | — | — | — |
| | | DBTDL | | | 0.5 | 0.5 | 0.5 | 0.5 | 0.5 | 0.5 |
| Dropping tank | Polyisocyanate ingredient (C) | IPDI | | | 283.4 | 176.2 | 180.6 | 131.3 | 166.5 | 179.3 |
| | MEK | | | | 283.4 | 176.2 | 180.6 | 131.3 | 166.5 | 179.3 |
| Addition | DBTDL | | | | 0.05 | 0.05 | 0.05 | 0.05 | 0.05 | 0.05 |
| | AOI | | | | — | — | — | — | — | — |
| | HEA | | | | — | — | — | — | — | — |
| | MEK | | | | — | — | — | — | — | — |
| Dilution | MEK | | | | 500.0 | 500.0 | 500.0 | 500.0 | 500.0 | 500.0 |
| | Solid content (%) | | | | 40 | 40 | 40 | 40 | 40 | 40 |
| | Number average molecular weight | | | | 40400 | 43000 | 82000 | 59200 | 47000 | 44200 |
| | Weight average molecular weight | | | | 81000 | 77000 | 146000 | 118000 | 96000 | 88500 |
| | (Meth)acryloyl group equivalent | | | | 8080 | 6670 | 6700 | 11100 | 4180 | 6630 |
| | Urethane bond equivalent | | | | 392 | 631 | 615 | 846 | 668 | 620 |
| | Concentration of carbonate group (mmol/g) | | | | 3.7 | 4.9 | 4.8 | 5.4 | 5.1 | 4.9 |
| | Concentration (mmol/g) of alicycle skeleton originated from diol ingredient (A1) | | | | 0.62 | 0.38 | 0.37 | 0.14 | 0.13 | 0.38 |
| | Glass transition temperature (° C.) | | | | −19 | −29 | −28 | −27 | −35 | −28 |

TABLE 2

| Process | Raw material | | | | Examples 7 D-7 | 8 D-8 | 9 D-9 | 10 D-10 | 11 D-11 |
|---|---|---|---|---|---|---|---|---|---|
| Polymerization tank | | MEK | | | 862.8 | 864.2 | 868.0 | 871.6 | 869.2 |
| | Diol ingredient (a2), etc. | C-1090 | Polycarbonate | Mn = 1000 | — | — | — | — | — |
| | | C-2050 | Polycarbonate | Mn = 2000 | — | — | — | — | — |
| | | C-2090R | Polycarbonate | Mn = 2000 | 814.2 | 805.7 | — | — | — |
| | | C-3090 | Polycarbonate | Mn = 3000 | — | — | 809.8 | 821.5 | 819.3 |
| | | P-3010 | Polyester | Mn = 3000 | — | — | — | — | — |
| | Diol ingredient (a3) | CHDM | | | 19.8 | — | 40.5 | 41.1 | 41.0 |
| | | RIKABINOL HB | | | — | 32.7 | — | — | — |
| | Polyol ingredient (B) | Epoxy ester 70PA | | | — | 25.8 | 17.7 | 9.0 | 9.0 |
| | | Epoxy ester 3000A | | | — | — | — | — | — |
| | | BLEMMER GML | | | — | — | — | — | — |
| | | Epoxy ester 80MFA | | | 28.8 | — | — | — | — |
| | | DBTDL | | | 0.5 | 0.5 | 0.5 | 0.5 | 0.5 |
| Dropping tank | Polyisocyanate ingredient (C) | IPDI | | | 137.2 | 135.8 | 132.0 | 128.4 | 130.8 |
| | MEK | | | | 137.2 | 135.8 | 132.0 | 128.4 | 130.8 |
| Addition | DBTDL | | | | 0.05 | 0.05 | 0.05 | 0.05 | 0.05 |
| | AOI | | | | — | — | — | — | — |
| | HEA | | | | — | — | — | — | — |
| | MEK | | | | — | — | — | — | — |
| Dilution | MEK | | | | 500.0 | 500.0 | 500.0 | 500 | 500 |
| | Solid content (%) | | | | 40 | 40 | 40 | 40 | 40 |
| | Number average molecular weight | | | | 60500 | 61100 | 45000 | 44000 | 76000 |
| | Weight average molecular weight | | | | 119000 | 122000 | 81000 | 75000 | 128000 |
| | (Meth)acryloyl group equivalent | | | | 6050 | 6110 | 8900 | 17560 | 17600 |
| | Urethane bond equivalent | | | | 810 | 818 | 842 | 865 | 850 |
| | Concentration of carbonate group (mmol/g) | | | | 5.3 | 5.3 | 5.4 | 5.5 | 5.5 |
| | Concentration (mmol/g) of alicycle skeleton originated from diol ingredient (A1) | | | | 0.14 | 0.55 | 0.28 | 0.29 | 0.28 |
| | Glass transition temperature (° C.) | | | | −34 | −31 | −30 | −30 | −28 |

TABLE 3

| Process | Raw material | | Examples 12 D-12 | 13 D-13 | 14 D-14 | 15 D-15 | 16 D-16 |
|---|---|---|---|---|---|---|---|
| Polymerization tank | | MEK | 795.9 | 795.9 | 795.9 | 754.1 | 756.1 |
| | Diol ingredient (a1), etc. | ETERNACOLL UM-90(3/1) | 768.9 | — | — | — | — |
| | | ETERNACOLL UM-90(1/1) | — | 768.9 | — | — | — |
| | | ETERNACOLL UM-90(1/3) | — | — | 768.9 | 700.2 | 694.4 |
| | Diol ingredient (a3) | CHDM | — | — | — | 12.5 | — |
| | | RIKABINOL HB | — | — | — | — | 20.6 |
| | Polyol ingredient (B) | Epoxy ester 70PA | 27.0 | 27.0 | 27.0 | — | — |
| | | BLEMMER GLM | — | — | — | 41.5 | 41.1 |
| | | DBTDL | 0.5 | 0.5 | 0.5 | 0.5 | 0.5 |
| Dropping tank | Polyisocyanate ingredient (C) | IPDI | 204.1 | 204.1 | 204.1 | 245.9 | 243.9 |
| | | MEK | 204.1 | 204.1 | 204.1 | 245.9 | 243.9 |
| Addition | | DBTDL | 0.05 | 0.05 | 0.05 | 0.05 | 0.05 |
| Dilution | | MEK | 500.0 | 500.0 | 500.0 | 500.0 | 500.0 |
| | Solid content (%) | | 40 | 40 | 40 | 40 | 40 |
| | Number average molecular weight | | 46800 | 46800 | 46800 | 57800 | 58300 |
| | Weight average molecular weight | | 93700 | 93800 | 93000 | 114000 | 116200 |
| | (Meth)acryloyl group equivalent | | 5850 | 5850 | 5850 | 3860 | 3890 |
| | Urethane bond equivalent | | 544 | 544 | 544 | 451 | 455 |
| | Concentration of carbonate group (mmol/g) | | 4.1 | 4.3 | 4.4 | 4.0 | 4.0 |
| | Concentration (mmol/g) of alicycle skeleton originated from diol ingredient (A1) | | 3.06 | 2.13 | 1.11 | 1.10 | 1.35 |
| | Glass transition temperature (° C.) | | −24 | −30 | −35 | −29 | −27 |

TABLE 4

| Process | Raw material | | | | Examples 17 D-17 | 18 D-18 | 19 D-19 | 20 D-20 | 21 D-21 | 22 D-22 |
|---|---|---|---|---|---|---|---|---|---|---|
| Polymerization tank | | MEK | | | 872.8 | 763.9 | 834.1 | 813.2 | 739.4 | 825.7 |
| | Diol ingredient (a2), etc. | C-1090 | Polycarbonate | Mn = 1000 | — | — | — | — | — | — |
| | | C-2050 | Polycarbonate | Mn = 2000 | 833.7 | 638.7 | 747.6 | 729.1 | 506.6 | 764.4 |
| | | C-2090R | Polycarbonate | Mn = 2000 | — | — | — | — | — | — |
| | | C-3090 | Polycarbonate | Mn = 3000 | — | — | — | — | — | — |
| | | P-3010 | Polyester | Mn = 3000 | — | — | — | — | — | — |
| | Diol ingredient (a3) | CHDM | | | 9.9 | 94.6 | 55.3 | 54.0 | 52.5 | 56.6 |
| | | RIKABINOL HB | | | — | — | — | — | — | — |
| | Polyol ingredient (B) | Epoxy ester 70PA | | | 29.7 | 31.1 | 31.5 | 30.8 | 180.8 | 5.0 |
| | | Epoxy ester 3000A | | | — | — | — | — | — | — |
| | | BLEMMER GML | | | — | — | — | — | — | — |
| | | Epoxy ester 80MFA | | | — | — | — | — | — | — |
| | | DBTDL | | | 0.5 | 0.5 | 0.5 | 0.5 | 0.5 | 0.5 |
| Dropping tank | Polyisocyanate ingredient (C) | IPDI | | | 126.7 | 235.6 | 165.5 | 186.2 | 260.1 | 173.7 |
| | | MEK | | | 126.7 | 235.6 | 165.5 | 186.2 | 260.1 | 173.7 |
| Addition | | DBTDL | | | 0.05 | 0.05 | 0.05 | 0.05 | 0.05 | 0.05 |
| | | AOI | | | — | — | — | — | — | — |
| | | HEA | | | — | — | — | — | — | — |
| | | MEK | | | — | — | — | — | — | — |
| Dilution | | MEK | | | 500.0 | 500.0 | 500.0 | 500.0 | 500.0 | 500.0 |
| | Solid content (%) | | | | 40 | 40 | 40 | 40 | 40 | 40 |
| | Number average molecular weight | | | | 45000 | 43200 | 8900 | 125000 | 41000 | 47700 |
| | Weight average molecular weight | | | | 92000 | 85600 | 19600 | 198000 | 86000 | 96200 |
| | (Meth)acryloyl group equivalent | | | | 5310 | 5083 | 5011 | 5138 | 854 | 31840 |
| | Urethane bond equivalent | | | | 877 | 471 | 672 | 597 | 427 | 640 |
| | Concentration of carbonate group (mmol/g) | | | | 5.4 | 4.2 | 4.9 | 4.8 | 3.3 | 5.0 |
| | Concentration (mmol/g) of alicycle skeleton originated from diol ingredient (A1) | | | | 0.07 | 0.66 | 0.38 | 0.37 | 0.36 | 0.39 |
| | Glass transition temperature (° C.) | | | | −55 | −15 | −30 | −29 | −28 | −30 |

TABLE 5

| Process | Raw material | | | Comparative Examples 1 D-23 | 2 D-24 | 3 D-25 | 4 D-26 | 5 D-27 |
|---|---|---|---|---|---|---|---|---|
| Polymerization tank | | MEK | | 869.4 | 862.5 | 875.7 | 872.2 | 811.0 |
| | Diol ingredient (a2), etc. | C-1090 | Polycarbonate Mn = 1000 | — | — | — | — | 785.7 |
| | | C-2050 | Polycarbonate Mn = 2000 | — | — | — | — | — |
| | | C-2090R | Polycarbonate Mn = 2000 | — | — | — | — | — |
| | | C-3090 | Polycarbonate Mn = 3000 | 834.1 | 826.7 | — | — | — |
| | | P-3010 | Polyester Mn = 3000 | — | — | 827.2 | 815.8 | — |
| | Diol ingredient (a3) | CHDM | | 41.7 | 41.3 | 39.8 | 39.2 | — |
| | | RIKABINOL HB | | — | — | — | — | — |
| | Polyol ingredient (B) | Epoxy ester 70PA | | — | — | 8.7 | 17.2 | 25.3 |
| | | Epoxy ester 3000A | | — | — | — | — | — |
| | | BLEMMER GML | | — | — | — | — | — |
| | | Epoxy ester 80MFA | | — | — | — | — | — |
| | | DBTDL | | 0.5 | 0.5 | 0.5 | 0.5 | 0.5 |
| Dropping tank | Polyisocyanate ingredient (C) | IPDI | | 124.2 | 132.0 | 124.3 | 127.8 | 189.0 |
| | | MEK | | 124.2 | 132.0 | 124.3 | 127.8 | 189.0 |
| Addition | | DBTDL | | 0.05 | 0.05 | 0.05 | 0.05 | 0.05 |
| | | AOI | | 6.4 | — | — | — | — |
| | | HEA | | — | 5.5 | — | — | — |
| | | MEK | | 6.4 | 5.5 | — | — | — |
| Dilution | | MEK | | 500 | 500 | 500 | 500.0 | 500.0 |
| | Solid content (%) | | | 40 | 40 | 40 | 40 | 40 |
| | Number average molecular weight | | | 44000 | 42000 | 45000 | 46000 | 41000 |
| | Weight average molecular weight | | | 76000 | 72000 | 77000 | 83000 | 74000 |
| | (Meth)acryloyl group equivalent | | | 22000 | 21000 | 18130 | 9190 | 6250 |
| | Urethane bond equivalent | | | 895 | 842 | 894 | 870 | 588 |
| | Concentration of carbonate group (mmol/g) | | | 5.6 | 5.5 | 0 | 0 | 5.0 |
| | Concentration (mmol/g) of alicycle skeleton originated from diol ingredient (A1) | | | 0.29 | 0.29 | 0.28 | 0.27 | 0 |
| | Glass transition temperature (° C.) | | | −30 | −30 | −55 | −55 | −25 |

Details of the ingredients in Tables 1 to 5 are as follows:

C-1090: manufactured by Kuraray Co., Ltd., polycarbonatediol, number average molecular weight=1,000

C-2050: manufactured by Kuraray Co., Ltd., polycarbonatediol number average, molecular weight=2,000

C-2090R: manufactured by Kuraray Co., Ltd., polycarbonatediol, number average molecular weight=2,000

C-3090: manufactured by Kuraray Co., Ltd., polycarbonatediol, number average molecular weight=3,000

P-3090: manufactured by Kuraray Co., Ltd., polyesterdiol, number average molecular weight=3,000

ETERNACOLL UM-90 (3/1): polycarbonatediol prepared by using 1,4-cyclohexane dimethanol/1,6-hexandiol=3/1 (molar ratio) as a raw material, number average molecular weight=900

ETERNACOLL UM-90 (1/1): polycarbonatediol prepared by using 1,4-cyclohexanedimethanol/1,6-hexandiol=1/1 (molar ratio) as a raw material, number average molecular weight=900

ETERNACOLL UM-90 (1/3): polycarbonatediol prepared by using 1,4-cyclohexane dimethanol/1,6-hexandiol=1/3 (molar ratio) as a raw material, number average molecular weight=900

CHDM: cyclohexane dimethanol

Rikabinol HB: manufactured by New Japan Chemical Co., Ltd., 2,2-bis(4-hydroxycyclohexyl)propane, also referred to as hydrogenated bisphenol A Epoxy ester 70A: manufactured by Kyoei Kagaku Kogyo, a compound obtained by adding 2 moles of acrylic acid to propylene glycol diglycidyl ether Epoxy ester 3000A: a compound obtained by adding 2 moles of acrylic acid to bisphenol A diglycidyl ether BLEMMER GML: glycerine monomethacrylate Epoxy ester 80MFA: a compound obtained by adding 2 moles of acrylic acid to glycerin diglycidyl ether IPDI: isophorone diisocyanate DBTL: dibutyltin dilaurate AOI: 2-acryloyloxyethyl isocyanate (KARENZ AOI, manufactured by Showa Denko K.K.)

HEA: hydroxyethyl acrylate

MEK: methyl ethyl ketone

Actinic Energy Ray Curable Adhesives 1 to 27

Examples 23 to 44 and Comparative Examples 6 to 10

The urethane resin solution (D) obtained by the above synthesis, the epoxy resin (E), an actinic energy ray curable compound, a photopolymerization initiator, and other ingredients were mixed at weight ratios shown in Tables 6 to 8 to obtain actinic energy ray curable adhesives.

TABLE 6

| | | | Examples | | | | | | | | | | |
|---|---|---|---|---|---|---|---|---|---|---|---|---|---|
| | | | 23 | 24 | 25 | 26 | 27 | 28 | 29 | 30 | 31 | 32 | 33 |
| Actinic energy ray curable adhesive | | | 1 | 2 | 3 | 4 | 5 | 6 | 7 | 8 | 9 | 10 | 11 |
| Urethane resin (D) | Solution (D-1) | | 200 | | | | | | | | | | |
| | Solution (D-2) | | | 180 | | | | | | | | | |
| | Solution (D-3) | | | | 200 | | | | | | | | |

TABLE 6-continued

| | | Examples | | | | | | | | | | |
|---|---|---|---|---|---|---|---|---|---|---|---|---|
| | | 23 | 24 | 25 | 26 | 27 | 28 | 29 | 30 | 31 | 32 | 33 |
| | Solution (D-4) | | | | 200 | | | | | | | |
| | Solution (D-5) | | | | | 195 | | | | | | |
| | Solution (D-6) | | | | | | 195 | | | | | |
| | Solution (D-7) | | | | | | | 195 | | | | |
| | Solution (D-8) | | | | | | | | 195 | | | |
| | Solution (D-9) | | | | | | | | | 200 | | |
| | Solution (D-10) | | | | | | | | | | 200 | |
| | Solution (D-11) | | | | | | | | | | | 180 |
| | Solution (D-12) | | | | | | | | | | | |
| | Solution (D-13) | | | | | | | | | | | |
| | Solution (D-14) | | | | | | | | | | | |
| | Solution (D-15) | | | | | | | | | | | |
| | Solution (D-16) | | | | | | | | | | | |
| | Solution (D-17) | | | | | | | | | | | |
| | Solution (D-18) | | | | | | | | | | | |
| | Solution (D-19) | | | | | | | | | | | |
| | Solution (D-20) | | | | | | | | | | | |
| | Solution (D-21) | | | | | | | | | | | |
| | Solution (D-22) | | | | | | | | | | | |
| Epoxy resin (E) | EPICOAT 1001 | 15 | | 25 | 15 | 15 | 15 | 15 | 15 | 25 | 15 | |
| | EPICOAT 1002 | | 20 | | | | | | | | | 15 |
| | EPICOAT 1009 | | | | | | | | | | | |
| Actinic energy ray curable compound | IBXA | | | | | 2 | 2 | | | | | |
| | M210 | | | | | | | | 2 | 2 | | |
| | M305 | 5 | | 5 | | | | | | | | |
| | M315 | | 5 | | 5 | | | 3 | 3 | | 5 | |
| | BEAMSET 700 | | | | | 3 | 3 | | | 5 | | 3 |
| | BISCOAT #230 | | | 5 | | | | | | 5 | | 10 |
| Photopolymerization initiator | IRGACURE 184 | | | | 3 | 3 | 3 | 3 | 3 | | | 2 |
| | IRGACURE 369 | | | | | | | | | | | |
| | IRGACURE 819 | 5 | 5 | 5 | 2 | 2 | 2 | 2 | 2 | 5 | 5 | 8 |
| Aziridine | CHEMITIGHT DZ-22E | | | 5 | | | | | | | | |
| | CHEMITIGHT PZ-33 | | 3 | | | 2 | 2 | 2 | 2 | 5 | | |
| Silane coupling agent | S-510 | | | 5 | 5 | | | | | | | |
| Solvent | Ethyl acetate | 195 | 222 | 270 | 195 | 198 | 198 | 198 | 198 | 270 | 195 | 222 |
| Tg (° C.) of the cured product | | 5 | 10 | 10 | −6 | −2 | −10 | −9 | −6 | 3 | 7 | 10 |

TABLE 7

| | | Examples | | | | | | | | | | |
|---|---|---|---|---|---|---|---|---|---|---|---|---|
| | | 34 | 35 | 36 | 37 | 38 | 39 | 40 | 41 | 42 | 43 | 44 |
| Actinic energy ray curable adhesive | | 12 | 13 | 14 | 15 | 16 | 17 | 18 | 19 | 20 | 21 | 22 |
| Urethane resin (D) | Solution (D-1) | | | | | | | | | | | |
| | Solution (D-2) | | | | | | | | | | | |
| | Solution (D-3) | | | | | | | | | | | |
| | Solution (D-4) | | | | | | | | | | | |
| | Solution (D-5) | | | | | | | | | | | |
| | Solution (D-6) | | | | | | | | | | | |
| | Solution (D-7) | | | | | | | | | | | |
| | Solution (D-8) | | | | | | | | | | | |
| | Solution (D-9) | | | | | | | | | | | |
| | Solution (D-10) | | | | | | | | | | | |
| | Solution (D-11) | | | | | | | | | | | |
| | Solution (D-12) | 200 | | | | | | | | | | |
| | Solution (D-13) | | 200 | | | | | | | | | |
| | Solution (D-14) | | | 200 | | | | | | | | |
| | Solution (D-15) | | | | 200 | | | | | | | |
| | Solution (D-16) | | | | | 200 | | | | | | |
| | Solution (D-17) | | | | | | 200 | | | | | |
| | Solution (D-18) | | | | | | | 200 | | | | |
| | Solution (D-19) | | | | | | | | 200 | | | |
| | Solution (D-20) | | | | | | | | | 200 | | |
| | Solution (D-21) | | | | | | | | | | 200 | |
| | Solution (D-22) | | | | | | | | | | | 200 |
| Epoxy resin (E) | EPICOAT 1001 | 15 | 15 | 15 | 15 | 15 | 15 | 15 | 15 | 15 | 15 | 15 |
| | EPICOAT 1002 | | | | | | | | | | | |
| | EPICOAT 1009 | | | | | | | | | | | |
| Actinic energy ray curable compound | IBXA | 2 | 2 | | | | | | | | | |
| | M210 | | | 3 | 3 | 3 | | | | | | |
| | M305 | 3 | 3 | | | | | | | | | |

TABLE 7-continued

| | | Examples | | | | | | | | | | |
|---|---|---|---|---|---|---|---|---|---|---|---|
| | | 34 | 35 | 36 | 37 | 38 | 39 | 40 | 41 | 42 | 43 | 44 |
| | M315 | | | | | | 5 | 5 | 5 | 5 | 5 | 5 |
| | BEAMSET 700 | | | | | | | | | | | |
| | BISCOAT #230 | | | | | | | | | | | |
| Photopolymerization initiator | IRGACURE 184 | 3 | 3 | 3 | 3 | 3 | | | | | | |
| | IRGACURE 369 | | | | | | | | | | | |
| | IRGACURE 819 | 2 | 2 | 2 | 2 | 2 | 5 | 5 | 5 | 5 | 5 | 5 |
| Aziridine | CHEMITIGHT DZ-22E | | | | | | | | | | | |
| | CHEMITIGHT PZ-33 | | | | | 2 | 2 | | | | | |
| Silane coupling agent | S-510 | | | | 2 | 2 | 2 | | | | | |
| Solvent | Ethyl acetate | 195 | 195 | 195 | 198 | 198 | 195 | 195 | 195 | 195 | 195 | 195 |
| Tg (° C.) of the cured product | | 1 | −6 | −10 | −4 | −2 | −17 | 15 | 8 | 7 | 9 | 8 |

TABLE 8

| | | Comparative Examples | | | | |
|---|---|---|---|---|---|---|
| | | 6 | 7 | 8 | 9 | 10 |
| Actinic energy ray curable adhesive | | 23 | 24 | 25 | 26 | 27 |
| Urethane resin (D) | Solution (D-23) | 200 | | | | |
| | Solution (D-24) | | 200 | | | |
| | Solution (D-25) | | | 200 | | |
| | Solution (D-26) | | | | 180 | |
| | Solution (D-27) | | | | | 175 |
| Epoxy resin (E) | EPICOAT 1001 | | | | | |
| | EPICOAT 1002 | | 10 | | 20 | 15 |
| | EPICOAT 1009 | 20 | | 10 | | |
| Actinic energy ray curable compound | IBXA | | | | | |
| | M210 | | | 5 | | |
| | M305 | | | | 5 | |
| | M315 | | 5 | | | 5 |
| | BEAMSET 700 | | | 5 | | |
| | BISCOAT #230 | 5 | | | | |
| Photo-polymerization initiator | IRGACURE 184 | 5 | 5 | 5 | | |
| | IRGACURE 369 | | | 5 | | |
| | IRGACURE 819 | 5 | 2 | | 5 | 5 |
| Aziridine | CHEMITIGHT DZ-22E | | | | | |
| | CHEMITIGHT PZ-33 | | | | 3 | 10 |
| Silane coupling agent | S-510 | | | | 5 | 5 |
| Solvent | Ethyl acetate | 210 | 201 | 210 | 222 | 225 |
| Tg (° C.) of the cured product | | −5 | 0 | −16 | −15 | 10 |

The details of the ingredients shown in Tables 6 to 8 are as follows:

Epicoat 828: epoxy resin (manufactured by Japan Epoxy Resins Co., Ltd.), number average molecular weight: 370

Epicoat 1001: epoxy resin (manufactured by Japan Epoxy Resins Co., Ltd.), number average molecular weight: 900

Epicoat 1002: epoxy resin (manufactured by Japan Epoxy Resins Co., Ltd.), number average molecular weight: 1,200

Epicoat 1009: epoxy resin (manufactured by Japan Epoxy Resins Co., Ltd.), number average molecular weight: 3,800

IBXA: isobornyl acrylate (manufactured by Osaka Organic Chemical Industry Ltd.)

M-210: EO-modified bisphenol A diacrylate (manufactured by Toagosei Co., Ltd.)

M305: pentaerythritol triacrylate (manufactured by Toagosei Co., Ltd.)

M315: isocyanuric acid EO-modified triacrylate (manufactured by Toagosei Co., Ltd.)

Beam set 700: dipentaerythritol hexaacrylate (manufactured by Arakawa Chemical Industries, Ltd.)

Biscoat #230: 1,6-hexanediol diacrylate (manufactured by Osaka Organic Chemical Industry Ltd.)

IRGACURE 184: 1-hydroxycyclohexyl phenyl ketone (manufactured by Ciba Specialty Chemicals Inc.)

IRGACURE 369: 2-benzyl-2-dimethylamino-1-(4-morpholinophenyl)-butanone-1 (manufactured by Ciba Specialty Chemicals Inc.)

IRGACURE 819: bis(2,4,6-trimethylbenzoyl)-phenylphosphine oxide (manufactured by Ciba Specialty Chemicals Inc.)

Chemitight DZ-22E: 4,4-bis(ethyleneiminocarbonylamino)diphenylmethane (manufactured by NIPPON SHOKUBAI CO., LTD.)

Chemitight PZ-33: 2,2-bis-hydroxymethylbutanol-tris[3-(1-aziridinyl)propionate] (manufactured by NIPPON SHOKUBAI CO., LTD.)

S-510: 3-glycidoxypropyltrimethoxysilane (manufactured by Chisso Corporation)

The glass transition temperatures (Tg) of the cured products of the adhesives shown in Tables 6 to 8 were calculated as follows.

A cured adhesive sheet having a thickness of about 200 μm was formed and measurement using a dynamic viscoelasticity measuring device: DVA-200 (manufactured by IT Keisoku Seigyo Co., Ltd.) was performed thereon. The glass transition temperature was the temperature at which tan δ exhibited the peak value.

The cured adhesive sheet was obtained by coating a polyester film having a silicone-based releasing layer with an adhesive by a blade coater, drying a solvent, irradiating it with ultraviolet rays (with a 120 W metal halide lamp, integrated amount of light in a UV-A region: 500 mJ/cm$^2$) to form an actinic energy ray-cured adhesive layer, and further separating the polyester film from the adhesive layer.

Methods 1 to 3 of Producing Back Protective Sheet for a Solar Cell

Production Method 1

The actinic energy ray curable adhesive was applied to a sheet member (S1) and the solvent was vaporized from the coating film. Subsequently, the sheet member (S1) and another sheet member (S2) were laminated with the coating film interposed between the members. This laminate was made to pass between two rolls set at 60° C. Thereafter, the laminate was irradiated with ultraviolet rays (with a 120 W metal halide lamp, integrated amount of light in a UV-A region: 500 mJ/cm$^2$) from the side of the sheet member (S2) to form an actinic energy ray-cured adhesive layer.

A back protective sheet for a solar cell was obtained as described above. The amount of the adhesive layer was from 8 to 10 g/m$^2$.

Production Method 2

The actinic energy ray curable adhesive was applied to a sheet member (S1) and the solvent was vaporized from the coating film. Then, the coating film was irradiated with ultraviolet rays (with a 120 W high-pressure mercury lamp, quantity of light in a UV-A region: 200 mJ/cm$^2$) from the surface side to form an actinic energy ray-cured adhesive layer. Thereafter, the sheet member (S1) and another sheet member (S2) were laminated with the actinic energy ray curable adhesive layer interposed between the members. This laminate was made to pass between two rolls set at 60° C.

A back protective sheet for a solar cell was obtained as described above. The amount of the adhesive layer was from 8 to 10 g/m$^2$.

Production Method 3

The actinic energy ray curable adhesive was applied to a sheet member (S1) and the solvent was vaporized from the coating film. Then, the coating film was irradiated with ultraviolet rays (with a 120 W high-pressure mercury lamp, quantity of light in a UV-A region: 200 mJ/cm$^2$) from the surface side to form an actinic energy ray cured adhesive layer. Thereafter, the sheet member (S1) and another sheet member (S2) were laminated with the actinic energy ray-cured adhesive layer interposed between the members. This laminate was made to pass between two rolls set at 60° C.

Subsequently, the actinic energy ray curable adhesive was applied to one main surface of this laminate and the solvent was vaporized from the coating film. Then, the coating film was irradiated with ultraviolet rays (with a 120 W high-pressure mercury lamp, quantity of light in a UV-A region: 200 mJ/cm$^2$) from the surface side to form an actinic energy ray-cured adhesive layer. Thereafter, the above laminates and another sheet member (S3) were laminated with the actinic energy ray-cured adhesive layer interposed between the members. This laminate was made to pass between two rolls set at 60° C.

A back protective sheet for a solar cell was obtained as described above. The amount of the two adhesive layers was from 8 to 10 g/m$^2$.

Examples 45 to 73 and Comparative Examples 11 to 22

The actinic energy ray curable adhesive, the method of producing a back protective sheet for a solar cell, and the sheet member were combined as shown in Tables 9 to 13 to obtain back protective sheets for solar cells. Then, the adhesive properties, moist-heat resistance, productivity, and presence of air bubbles were evaluated in accordance with a method to be described later. The results are shown in Tables 9 to 13.

TABLE 9

| | | | Examples | | | | | | | | | |
|---|---|---|---|---|---|---|---|---|---|---|---|---|
| | | | 45 | 46 | 47 | 48 | 49 | 50 | 51 | 52 | 53 | 54 |
| Actinic energy ray curable adhesive | | | 1 | 1 | 1 | 1 | 1 | 1 | 1 | 1 | 2 | 3 |
| Method of producing back protective sheet | | | 1 | 2 | 3 | 3 | 3 | 3 | 3 | 3 | 3 | 3 |
| Sheet member | S1 | | PET(1) | PET(1) | PVF | PET(1) | PET(1) | Vapor-Deposited PET | EVA | PET(1) | PET(1) | PET(1) |
| | S2 | | Vapor-Deposited PET | AL(1) | PET(1) | Vapor-Deposited PET | AL(2) | Vapor-Deposited PET | PET(1) | AL(2) | AL(2) | AL(2) |
| | S3 | | | | PVF | Black PET | KFC | PET(1) | AL(1) | White PET | White PET | White PET |
| Adhesive Properties | S1/S2 interface | Adhesion | 2.3 | 2.5 | 2.8 | 2.7 | 2.5 | 2.5 | 6.3 | 2.4 | 5.2 | 5.3 |
| | | Evaluation | ○ | ○ | ○ | ○ | ○ | ○ | ◎ | ○ | ◎ | ◎ |
| | S2/S3 interface | Adhesion | | | 2.6 | 2.6 | 2.7 | 2.8 | 2.9 | 2.7 | 5.3 | 5 |
| | | Evaluation | | | ○ | ○ | ○ | ○ | ○ | ○ | ◎ | ◎ |
| Resistance to moist heat for 1000 hours | S1/S2 interface | Adhesion | 3.3 | 3.3 | 3.4 | 3.5 | 3.3 | 3.6 | 5.8 | 3.6 | 6.2 | 5.8 |
| | | Evaluation | ○ | ○ | ○ | ○ | ○ | ○ | ◎ | ○ | ◎ | ◎ |
| | S2/S3 interface | Adhesion | | | 3.5 | 3.4 | 3.3 | 3.5 | 3.6 | 3.8 | 5.8 | 5.5 |
| | | Evaluation | | | ○ | ○ | ○ | ○ | ○ | ○ | ◎ | ◎ |
| Resistance to moist heat for 2000 hours | S1/S2 interface | Adhesion | 3.2 | 3.4 | 3.4 | 3.6 | 3.3 | 3.4 | 5.7 | 4 | 5.5 | 5.6 |
| | | Evaluation | ○ | ○ | ○ | ○ | ○ | ○ | ◎ | ◎ | ◎ | ◎ |
| | S2/S3 interface | Adhesion | | | 3.3 | 3.4 | 3.5 | 3.5 | 3.7 | 3.8 | 5.4 | 5.5 |
| | | Evaluation | | | ○ | ○ | ○ | ○ | ○ | ○ | ◎ | ◎ |
| Productivity | | | ○ | ○ | ○ | ○ | ○ | ○ | ○ | ○ | ○ | ○ |
| Presence of air bubbles or loosened portions | | | ○ | ○ | ○ | ○ | ○ | ○ | ○ | ○ | ○ | ○ |

TABLE 10

| | Examples | | | | | | | | | |
|---|---|---|---|---|---|---|---|---|---|---|
| | 55 | 56 | 57 | 58 | 59 | 60 | 61 | 62 | 63 | 64 |
| Actinic energy ray curable adhesive | 4 | 5 | 6 | 7 | 8 | 9 | 10 | 11 | 12 | 13 |
| Method of producing back protective sheet | 3 | 3 | 3 | 3 | 3 | 3 | 3 | 3 | 3 | 3 |

TABLE 10-continued

|  |  |  | Examples | | | | | | | | | |
|---|---|---|---|---|---|---|---|---|---|---|---|---|
|  |  |  | 55 | 56 | 57 | 58 | 59 | 60 | 61 | 62 | 63 | 64 |
| Sheet member | S1 | | PET(1) | PET(1) | PET(1) | PET(1) | PET(1) | PET(1) | PET(1) | PET(1) | PET(1) | PET(1) |
|  | S2 | | AL(2) | AL(2) | AL(2) | AL(2) | AL(2) | AL(2) | AL(2) | AL(2) | AL(2) | AL(2) |
|  | S3 | | White PET | White PET | White PET | White PET | White PET | White PET | White PET | White PET | White PET | White PET |
| Adhesive properties | S1/S2 interface | Adhesion | 2.9 | 4.6 | 5.5 | 6.2 | 5.6 | 6 | 2.5 | 2.8 | 2.4 | 2.8 |
|  |  | Evaluation | ○ | ◎ | ◎ | ◎ | ◎ | ◎ | ○ | ○ | ○ | ○ |
|  | S2/S3 interface | Adhesion | 3 | 4.5 | 5.4 | 5.8 | 5.9 | 5.8 | 2.2 | 2.6 | 2.6 | 2.6 |
|  |  | Evaluation | ○ | ◎ | ◎ | ◎ | ◎ | ◎ | ○ | ○ | ○ | ○ |
| Resistance to moist heat for 1000 hours | S1/S2 interface | Adhesion | 3.8 | 5.3 | 5.2 | 5.2 | 5.8 | 4.2 | 3.8 | 4.2 | 4 | 4.1 |
|  |  | Evaluation | ○ | ◎ | ◎ | ◎ | ◎ | ◎ | ○ | ◎ | ◎ | ◎ |
|  | S2/S3 interface | Adhesion | 3.5 | 4.9 | 5.8 | 5.5 | 5.5 | 4.1 | 3.5 | 3.7 | 3.8 | 4.2 |
|  |  | Evaluation | ○ | ◎ | ◎ | ◎ | ◎ | ◎ | ○ | ○ | ○ | ◎ |
| Resistance to moist heat for 2000 hours | S1/S2 interface | Adhesion | 3.2 | 5.2 | 4.8 | 5.3 | 5.3 | 4.5 | 3.5 | 3.8 | 4.2 | 3.9 |
|  |  | Evaluation | ○ | ◎ | ◎ | ◎ | ◎ | ◎ | ○ | ○ | ◎ | ○ |
|  | S2/S3 interface | Adhesion | 3.3 | 5 | 5 | 5.2 | 5.2 | 3.8 | 3.8 | 3.6 | 4 | 3.9 |
|  |  | Evaluation | ○ | ◎ | ◎ | ◎ | ◎ | ○ | ○ | ○ | ◎ | ○ |
| Productivity | | | ○ | ○ | ○ | ○ | ○ | ○ | ○ | ○ | ○ | ○ |
| Presence of air bubbles or loosened portions | | | ○ | ○ | ○ | ○ | ○ | ○ | ○ | ○ | ○ | ○ |

TABLE 11

|  |  |  | Examples | | | | | | | | |
|---|---|---|---|---|---|---|---|---|---|---|---|
|  |  |  | 65 | 66 | 67 | 68 | 69 | 70 | 71 | 72 | 73 |
| Actinic energy ray curable adhesive | | | 14 | 15 | 16 | 17 | 18 | 19 | 20 | 21 | 22 |
| Method of producing back protective sheet | | | 3 | 3 | 3 | 3 | 3 | 3 | 3 | 3 | 3 |
| Sheet member | S1 | | PET(1) | PET(1) | PET(1) | PET(1) | PET(1) | PET(1) | PET(1) | PET(1) | PET(1) |
|  | S2 | | AL(2) | AL(2) | AL(2) | AL(2) | AL(2) | AL(2) | AL(2) | AL(2) | AL(2) |
|  | S3 | | White PET | White PET | White PET | White PET | White PET | White PET | White PET | White PET | White PET |
| Adhesive Properties | S1/S2 interface | Adhesion | 3 | 5.2 | 4.5 | 2.6 | 1.6 | 2.8 | 1.3 | 1.4 | 2.7 |
|  |  | Evaluation | ○ | ◎ | ◎ | ○ | Δ | ○ | Δ | Δ | ○ |
|  | S2/S3 interface | Adhesion | 3.2 | 4.9 | 4.4 | 2.5 | 1.4 | 2.7 | 1.4 | 1.4 | 2.7 |
|  |  | Evaluation | ○ | ◎ | ◎ | ○ | Δ | ○ | Δ | Δ | ○ |
| Resistance to moist heat for 1000 hours | S1/S2 interface | Adhesion | 3.9 | 5.5 | 5.2 | 4.4 | 4.6 | 4.2 | 4.7 | 4.8 | 4.1 |
|  |  | Evaluation | ○ | ◎ | ◎ | ◎ | ◎ | ◎ | ◎ | ◎ | ◎ |
|  | S2/S3 interface | Adhesion | 3.7 | 5.2 | 5 | 4.2 | 4.7 | 4.3 | 4.7 | 4.9 | 4.3 |
|  |  | Evaluation | ○ | ◎ | ◎ | ◎ | ◎ | ◎ | ◎ | ◎ | ◎ |
| Resistance to moist heat for 2000 hours | S1/S2 interface | Adhesion | 3.8 | 5.5 | 5.4 | 1.8 | 4.5 | 1.7 | 4.3 | 4.4 | 1.6 |
|  |  | Evaluation | ○ | ◎ | ◎ | Δ | ◎ | Δ | ◎ | ◎ | Δ |
|  | S2/S3 interface | Adhesion | 3.9 | 4.9 | 4.8 | 1.7 | 4.2 | 1.5 | 4.1 | 4.1 | 1.4 |
|  |  | Evaluation | ○ | ◎ | ◎ | Δ | ◎ | Δ | ◎ | ◎ | Δ |
| Productivity | | | ○ | ○ | ○ | ○ | ○ | ○ | ○ | ○ | ○ |
| Presence of air bubbles or loosened portions | | | ○ | ○ | ○ | ○ | ○ | ○ | ○ | ○ | ○ |

TABLE 12

|  |  | Comparative Examples | | | | | | |
|---|---|---|---|---|---|---|---|---|
|  |  | 11 | 12 | 13 | 14 | 15 | 16 | 17 |
| Actinic energy ray curable adhesive | | 23 | 23 | 23 | 23 | 23 | 23 | 23 |
| Method of producing back protective sheet | | 1 | 2 | 3 | 3 | 3 | 3 | 3 |
| Sheet member | S1 | PET(1) | PET(1) | PVF | PET(1) | PET(1) | Vapor-Deposited PET | EVA |

TABLE 12-continued

|  |  |  | Comparative Examples | | | | | | |
|---|---|---|---|---|---|---|---|---|---|
|  |  |  | 11 | 12 | 13 | 14 | 15 | 16 | 17 |
|  |  | S2 | Vapor-Deposited PET | AL(1) | PET(1) | Vapor-Deposited PET | AL(2) | Vapor-Deposited PET | PET(1) |
|  |  | S3 |  |  | PVF | Black PET | KFC | PET(1) | AL(1) |
| Adhesive properties | S1/S2 interface | Adhesion Evaluation | 2.8 ○ | 3.1 ○ | 2.8 ○ | 2.7 ○ | 2.5 ○ | 2.5 ○ | 6.3 ◉ |
|  | S2/S3 interface | Adhesion Evaluation |  |  | 2.6 ○ | 2.6 ○ | 2.7 ○ | 2.8 ○ | 2.9 ○ |
| Resistance to moist heat for 1000 hours | S1/S2 interface | Adhesion Evaluation | 2.2 ○ | 2.5 ○ | 2.2 ○ | 2.3 ○ | 2.2 ○ | 2.1 ○ | 4.5 ◉ |
|  | S2/S3 interface | Adhesion Evaluation |  |  | 2.4 ○ | 2.2 ○ | 2.5 ○ | 2.3 ○ | 2.2 ○ |
| Resistance to moist heat for 2000 hours | S1/S2 interface | Adhesion Evaluation | 0.7 X | 0.6 X | 0.5 X | 0.6 X | 0.6 X | 0.4 X | 0.8 X |
|  | S2/S3 interface | Adhesion Evaluation |  |  | 0.4 X | 0.5 X | 0.5 X | 0.4 X | 0.4 X |
|  | Productivity |  | ○ | ○ | ○ | ○ | ○ | ○ | ○ |
|  | Presence of air bubbles or loosened portions |  | ○ | ○ | ○ | ○ | ○ | ○ | ○ |

TABLE 13

|  |  |  | Comparative Examples | | | | |
|---|---|---|---|---|---|---|---|
|  |  |  | 18 | 19 | 20 | 21 | 22 |
| Actinic energy ray curable adhesive |  |  | 23 | 24 | 25 | 26 | 27 |
| Method of producing back protective sheet |  |  | 3 | 3 | 3 | 3 | 3 |
| Sheet member | S1 |  | PET(1) | PET(1) | PET(1) | PET(1) | PET(1) |
|  | S2 |  | AL(2) | AL(2) | AL(2) | AL(2) | AL(2) |
|  | S3 |  | White PET | White PET | White PET | White PET | White PET |
| Adhesive properties | S1/S2 interface | Adhesion Evaluation | 3 ○ | 3.1 ○ | 3.8 ○ | 6.2 ○ | 4.5 ○ |
|  | S2/S3 interface | Adhesion Evaluation | 3.3 ○ | 3 ○ | 4.1 ○ | 5.9 ○ | 4.7 ○ |
| Resistance to moist heat for 1000 hours | S1/S2 interface | Adhesion Evaluation | 2.4 ○ | 2.7 ○ | 1.5 Δ | 1.2 Δ | 4.5 ○ |
|  | S2/S3 interface | Adhesion Evaluation | 2.3 ○ | 2.6 ○ | 1.4 Δ | 1.2 Δ | 4.7 ○ |
| Resistance to moist heat for 2000 hours | S1/S2 interface | Adhesion Evaluation | 0.6 X | 0.5 X | 0.2 X | 0.1 X | 0.4 X |
|  | S2/S3 interface | Adhesion Evaluation | 0.6 X | 0.6 X | 0.3 X | 0.1 X | 0.5 X |
|  | Productivity |  | ○ | ○ | ○ | ○ | ○ |
|  | Presence of air bubbles or loosened portions |  | ○ | ○ | ○ | ○ | ○ |

The meanings of abbreviations used for the sheet members (S1 to S3) in Tables 9 to 13 are as follows.

PET (1): transparent and colorless polyethylene terephthalate film (188 μm in thickness)

Vapor-deposited PET: film obtained by vapor-depositing a mixture containing silicon oxide and magnesium fluoride at a ratio (mol %) of 90/10 on one side of a polyethylene terephthalate film (12 μm in thickness) in a thickness of 500 Å

AL (1): film obtained by forming 10μ of a weather resistance resin layer * on one side of an aluminum foil (30 μm thick)

Weather-resistant resin layer *: OBBLIGATO PS2012 (white) Base resin: curing agent (13:1) (manufactured by AGC COAT-TECH CO., LTD.)

AL(2): aluminum foil (30 μm in thickness)

White PET: white polyethylene terephthalate film (50 μm in thickness)

Black PET: black polyethylene terephthalate film (50 μm in thickness)

PVF: polyvinyl fluoride film; "Tedlar", manufactured by Du Pont Kabushiki Kaisha (38 μm in thickness)

KFC: multilayer film; "FT-50Y", manufactured by Kureha Extech Co., Ltd (50 μm in thickness)

EVA: ethylene•Vinyl acetate copolymer resin film (100 μm in thickness)

The evaluation method by which the results shown in Tables 9 to 13 were obtained and its evaluation criteria are as follows:

(1) Adhesive Properties

A back protective sheet for a solar cell was cut into a size of 200 mm×15 mm to obtain a specimen. A T-type peel test was performed on this specimen at a loading speed of 300 mm using a tension tester in accordance with a test method of ASTM D1876-61. The peel strength (N/15 mm-width) between the sheet members was shown as an average of five specimens.

⊚ . . . 4N or more
○ . . . 2N or more and less than 4N
Δ . . . 1N or more and less than 2N
x . . . less than 1N (2) Moist-heat Resistance A back protective sheet for a solar cell was stored at 85° C. and 85% RH for 1,000 and 2,000 hours. The stored back protective sheet for a solar cell was cut into a size of 200 mm×15 mm to obtain a specimen. A T-type peel test was performed on this specimen at a loading speed of 300 mm/minute using a tension tester in accordance with a test method of ASTM D1876-61. The peel strength (N/15 mm-width) between the sheet members was shown as an average of five specimens.

⊚ . . . 4N or more
○ . . . 2N or more and less than 4N
Δ . . . 1N or more and less than 2N
x . . . less than 1N (3) Productivity A rolled product of the back protective sheet for a solar cell having a width of 50 cm and a length of 500 m was produced. This rolled product was allowed to stand so that the axial direction of the winding core was in a vertical direction and then the outer periphery of the product was seized and lifted.

○ . . . No slip was occurred between the adhered sheet members and the rolled shape could be maintained.
x . . . A slip occurred between the adhered sheet members and the rolled shape could not be maintained.

(4) Presence of Air Bubbles and Loosened Portions

A rolled product of the back protective sheet for a solar cell having a width of 50 cm and a length of 500 m was produced. This rolled product was allowed to stand so that the axial direction of the winding core was in a vertical direction and stored in an environment of 60° C. for one week.

Thereafter, the presence of air bubbles was examined by observing a state of the adhesive layer through a transparent sheet member. The presence of loosened portions of the sheet member was also observed.

○ . . . No abnormality
Δ . . . . Large air bubbles and large loosened portions were not generated, but either small air bubbles or small loosened portions were generated
x . . . Either large air bubbles or large loosened portions were generated As shown in Tables 7 to 10, when the actinic energy ray curable adhesive which contains the urethane resin (D) having a glass transition temperature of −60 to −10° C. and the epoxy resin (E) is used, a back protective sheet for a solar cell excellent in the adhesion between the sheet members and moist-heat resistance can be produced without causing appearance defects and delamination by generation of air bubbles in the adhesive layer. In the production of the back protective sheet for a solar cell using these adhesives, an aging process to cure the adhesive layer is not needed. That is, the use of these adhesives enables a back protective sheet for a solar cell which is excellent in the adhesion between the sheet members and moist-heat resistance and does not cause appearance defects and delamination by generation of air bubbles in the adhesive layer to be obtained with high yields and high productivity at low cost.

The cured product obtained by curing the composition containing the urethane resin (D), which has been described herein, is excellent in adhesive properties to various substrates such as a plastic film and a metallic film and hardly causes deterioration under conditions of high temperature and humidity. Therefore, the above composition is suitably used for producing the back protective sheet for a solar cell, as well as for other applications such as optical materials such as a plastic lens, a prism, and an optical fiber; electric and electronic members such as a solder resist for flexible printed wiring boards and an interlayer insulation film for multilayer printed wiring boards; a coating agent for paper or plastic films; and an adhesive for food packages.

What is claimed is:

1. An actinic energy ray curable adhesive comprising:
a urethane resin (D); and
an epoxy resin (E),
the urethane resin (D) prepared by reacting the following ingredients with one another:
a diol ingredient (A1) having no (meth)acryloyl group and selected from the group consisting of
a diol (a1) having a carbonate structure and an alicyclic structure in a molecule,
a combination of a diol (a2) having no alicyclic structure but having a carbonate structure, and a diol (a3) having no carbonate structure but having an alicyclic structure, and
a combination of a diol (a1) and at least one of the diol (a2) and the diol (a3);
an optional diol ingredient (A2) having no (meth)acryloyl group, no carbonate structure and no alicyclic structure;
a polyol ingredient (B) having a (meth)acryloyl group and two or more hydroxyl groups in a molecule; and
a polyisocyanate ingredient (C),
wherein the urethane resin (D) has a glass transition temperature of −60 to −10° C., and
wherein the urethane resin (D) has carbonate groups and alicyclic skeletons originated from the diol ingredient and further has (meth)acryloyl groups originated from the polyol ingredient (B) at side chains of the urethane resin (D).

2. The actinic energy ray curable adhesive according to claim 1, wherein the number average molecular weight of the epoxy resin (E) is within a range of 500 to 5,000.

3. The actinic energy ray curable adhesive according to claim 1, wherein 5 to 40 parts by weight of the epoxy resin (E) is contained based on 100 parts by weight of the urethane resin (D).

4. The actinic energy ray curable adhesive according to claim 1, wherein a concentration of carbonate groups relative to a total solid content of the diol ingredient (A1), the diol ingredient (A2), the polyol ingredient (B), and the polyisocyanate ingredient (C) is from 2 to 8 mmol/g.

5. The actinic energy ray curable adhesive according to claim 1, wherein the number average molecular weight is within a range of 5,000 to 150,000.

6. The actinic energy ray curable adhesive according to claim 1, wherein the polyol ingredient (B) has two or more (meth)acryloyl groups in a molecule.

7. The actinic energy ray curable adhesive according to claim 6, wherein the polyol ingredient (B) is a compound obtained by adding (meth)acrylic acid to an epoxy group of a compound having two or more epoxy groups.

8. The actinic energy ray curable adhesive according to claim 1, wherein a (meth)acryloyl group equivalent of the urethane resin (D) is within a range of 500 to 40,000.

9. A back protective sheet for a solar cell comprising:
an actinic energy ray-cured adhesive layer formed from the actinic energy ray curable adhesive according to claim 1; and
two or more sheet members stacked together with the actinic energy ray-cured adhesive layer interposed therebetween.

10. The back protective sheet for a solar cell according to claim 9, wherein one of the sheet members is a metallic foil or a plastic film with a vapor-deposited layer formed by vapor-depositing a metal oxide or a nonmetallic inorganic oxide onto at least one of surfaces of the plastic film.

11. The back protective sheet for a solar cell according to claim 9, wherein the glass transition temperature of the actinic energy ray-cured adhesive layer is within a range of −20 to 20° C.

* * * * *